United States Patent [19]
Chikyu

[11] Patent Number: 5,812,424
[45] Date of Patent: Sep. 22, 1998

[54] RELAY CONTROL CIRCUIT

[75] Inventor: Masakazu Chikyu, Tokyo, Japan

[73] Assignee: Ando Electric Co., Ltd., Tokyo, Japan

[21] Appl. No.: 739,309

[22] Filed: Oct. 29, 1996

[30] Foreign Application Priority Data

Oct. 31, 1995 [JP] Japan .................................... 7-306927

[51] Int. Cl.$^6$ .................................................. H01H 9/00
[52] U.S. Cl. ......................... 364/550; 361/160; 361/191; 361/211
[58] Field of Search ................................... 364/550, 147, 364/140, 141; 307/132 E; 324/418; 340/644, 825.18; 361/160, 191, 211, 819; 375/352; 379/100.09; 371/22.1

[56] References Cited

U.S. PATENT DOCUMENTS

| | | | |
|---|---|---|---|
| 4,878,465 | 11/1989 | Hanson et al. | 123/179 BG |
| 4,907,230 | 3/1990 | Heller et al. | 371/22.1 |
| 5,101,153 | 3/1992 | Morong, III | 324/158 R |
| 5,389,990 | 2/1995 | Nakamura | 324/158.1 |
| 5,402,079 | 3/1995 | Levy | 324/765 |

*Primary Examiner*—James P. Trammel
*Assistant Examiner*—Patrick Assouad
*Attorney, Agent, or Firm*—Finnegan, Henderson, Farabow, Garrett & Dunner, L.L.P.

[57] ABSTRACT

A relay control circuit is provided to perform on/off control on multiple kinds of relays, each having a different operation speed, which are contained in a source-voltage supply circuit which is employed by an IC tester to perform DC-parameter measurement on ICs. The relay control circuit contains a timer-A and a timer-B, to which different relay-operation wait times are arbitrarily set, wherein the timer-A is set in response to a relay whose operation speed is slowest within the multiple kinds of relays. When a test instruction is executed in accordance with a test program, relay-select-information, representing at least one of the multiple kinds of relays, is generated. A relay-operation monitoring circuit, contained in the relay control circuit, monitors a driving relay by detecting coincidence between current relay-select-information, regarding a current test, and previous relay-select-information regarding a previous test. Both of the timers operate in response to a relay-on signal with respect to the driving relay. However, the timer-A is started only when the relay-operation monitoring circuit fails to detect the coincidence. An OR gate produces a relay-operation-wait control signal based on outputs of the timers, which represents a wait time for an operation of the driving relay. In short, one of the timers is selectively driven in conformity with an operation speed of the driving relay. This results in reduction of a test time for the IC tester.

8 Claims, 5 Drawing Sheets

RELAY CONTROL CIRCUIT

BACKGROUND OF THE INVENTION

1. Field of the Invention

The invention relates to relay control circuits which are used by IC testers to perform measurement of DC parameters.

2. Prior Art

The IC testers conventionally use source-voltage supply circuits for the DC-parameter measurement of testing ICs. An example of the source-voltage supply circuit is shown in FIG. 4 and is constructed by a testing IC (denoted by 'DUT' which represents 'Device Under Test') 50, a device power supply unit (denoted by 'BS unit' which represents 'Bias Unit') 60 and a driver circuit (denoted by 'DRV') 70.

The BS unit 60 is provided to generate a DC source voltage, which is arbitrarily set and is supplied to the DUT 50 as 'VDD'. The driver circuit 70 is provided to generate a test pattern as a test-pattern signal. The test pattern is determined in advance and is supplied to the DUT 50. When receiving the source voltage from the BS unit 60, the DUT 50 is put in an operational state, so that the DUT 50 executes a predetermined operation in response to the test-pattern signal given from the driver circuit 70.

In the BS unit 60, a direct voltage source (denoted by 'DAC') 601 is connected to resistors 602 and 603 in series. An output of the DAC 601 is supplied to the DUT 50 through the resistors 602 and 603 in the form of a voltage. Switches 604 and 605 are provided to switch over the resistors 603 and 604, thus changing over a value of a voltage which is applied to inputs of a voltage difference detector 606. The voltage difference detector 606 compares the output of the DAC 601 with the voltage whose value is selectively determined by the switches 604 and 605. Relays 607 and 608 are provided to selectively bypass the resistors 602 and 603. Further, a relay 701 is provided to switch on or off the outputting of the test-pattern signal from the driver circuit 70.

Since there is a need to secure the flow of large current in the BS unit 60, mercury relays, whose operation speed is relatively slow, are used as the relays 607 and 608. In contrast, a reed relay which is capable of operating at a high speed is used as the relay 701 provided for the driver circuit 70.

A conventional example of the relay control circuit is shown in FIG. 5 and is provided to control the relays of the source-voltage supply circuit of FIG. 4. The relay control circuit of FIG. 5 is constructed by a relay-select-operation-code generating circuit 10, a primary register 20, a secondary register 30 and a timer 40.

Operation codes are allocated to the relays 607 and 608 in the BS unit 60. The relay-select-operation-code generating circuit 10 generates operation codes to select the relays 607 and 608 in conformity with an electric-current range which is described by a test program. Then, operation-code data representing the operation codes are stored in the primary register 20 in accordance with of occurrence of clocks 'OPCK' which are provided for the operation codes.

The operation-code data, stored in the primary register 20, are stored in a secondary register 30 in accordance with a relay-on signal RLON. Thereafter, the operation-code data, stored in the secondary register 30, are supplied to the timer 40 through its AND-gate input. The relay-on signal RLON is supplied to the timer 40 as well through its AND-gate input.

The timer 40 is provided to set a wait time which is used to secure an operation time of the relay. Since there is provided only one timer 40 in the relay control circuit of FIG. 5, an operation time of the relays 607 and 607 is set to the timer 40 because an operation speed of the relays 607 and 608 is slow as compared to other relays in the BS unit 60. In a state where the relay-on signal RLON is inputted to the timer 40, when the secondary register 30 outputs the operation-code data to the timer 40, the timer 40 is started so as to continuously output a relay-operation-wait control signal to the driver circuit 70 until a set time thereof completely elapses. Thus, a test-pattern running operation is stopped.

FIG. 6 shows a flowchart showing a flow of processes executed by the relay control circuit. At first, when a TEST instruction of a test program is issued in step S1, a relay-on process is executed to produce a relay-on signal RLON in step S2. Thus, the operation-code data, outputted from the secondary register 30, together with the relay-on signal RLON, are inputted to the timer 40. So, the timer 40 is started to set a relay-operation wait time in step S3. After a lapse of the relay-operation wait time of the timer 40, electric power is switched on in step S4. Thus, execution of a test pattern is started.

As described above, the conventional example of the relay control circuit, which is used for the IC tester, is designed to control a relay-operation wait time by a single timer. So, the timer should be set in conformity with a relay-operation time of a relay whose operation speed is the slowest among the relays provided in the BS unit. However, some test program is constructed not to operate the relay (or relays) whose operation speed is slow. In such a test program, it takes a longer wait time, which is longer than the wait time actually required, because the timer has been already set in conformity with the relay-operation time of the 'slowest' relay. As a result, there is a problem that a test time, required for performing a test by the IC tester, becomes longer.

SUMMARY OF THE INVENTION

It is an object of the invention to provide a relay control circuit which is capable of reducing a test time by automatically selecting a wait time in conformity with an operation time of a relay to be driven.

A relay control circuit of the invention is provided to perform on/off control on multiple kinds of relays, each having a different operation speed, which are contained in a source-voltage supply circuit which is employed by an IC tester to perform DC-parameter measurement on ICs.

The relay control circuit contains a timer-A and a timer-B, to which different relay-operation wait times are arbitrarily set, wherein the timer-A is set in response to a relay whose operation speed is slowest within the multiple kinds of relays. When a test instruction is executed in accordance with a test program, relay-select-information, representing at least one of the multiple kinds of relays, is generated. The relay-select-information corresponds to operation-code data which are allocated to each of the relays. A relay-operation monitoring circuit, contained in the relay control circuit, monitors a driving relay by detecting coincidence between current relay-select-information, regarding a current test, and previous relay-select-information regarding a previous test. Both of the timers operate in response to a relay-on signal with respect to the driving relay. However, the timer-A is started only when the relay-operation monitoring circuit fails to detect the coincidence. An OR gate produces a relay-operation-wait control signal based on outputs of the timer-A and timer-B, which represents a wait time for an operation of the driving relay.

The relay-operation monitoring circuit is configured by circuitry consisting of a primary register for storing the current relay-select-information, a secondary register for storing the previous relay-select-information, and a comparator. The comparator performs comparison between outputs of the registers so as to detect the coincidence.

The relay-operation monitoring circuit can be configured in a more complicated way that two series of the circuitry are provided with respect to different relay-operation-monitoring conditions, thus providing a delicate control on selection of the timers.

The operation of the relay control circuit can be rendered such that one of the timers is selectively driven in conformity with an operation speed of the driving relay. This results in reduction of a test time for the IC tester.

BRIEF DESCRIPTION OF THE DRAWINGS

These and other objects of the subject invention will become more fully apparent as the following description is read in light of the attached drawings wherein.

DESCRIPTION OF THE PREFERRED EMBODIMENTS

Figure 1:
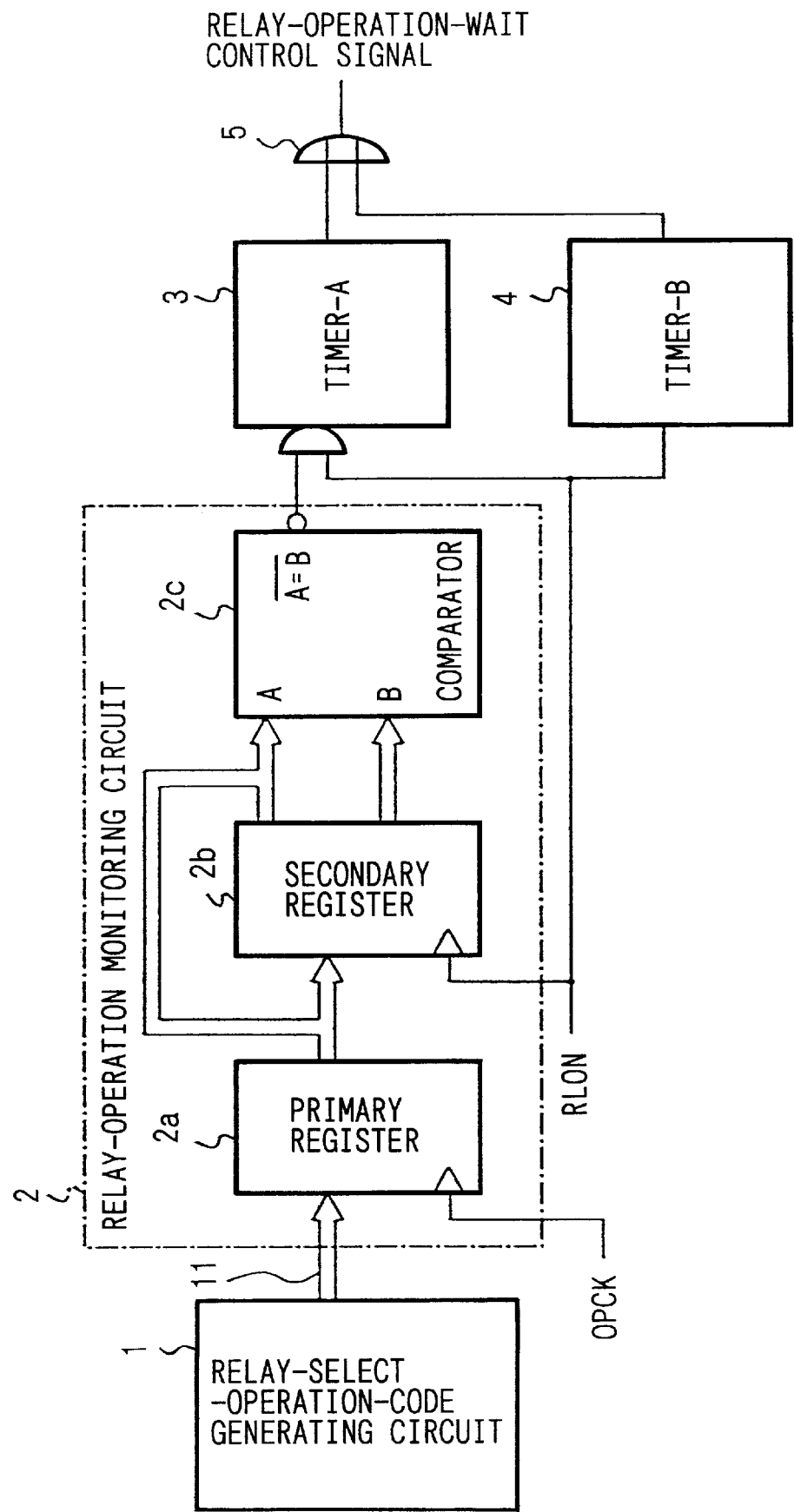
FIG. 1 is a block diagram showing a relay control circuit which is designed in accordance with a first embodiment of the invention and is used for the source-voltage supply circuit of the IC tester.
Figure 4:
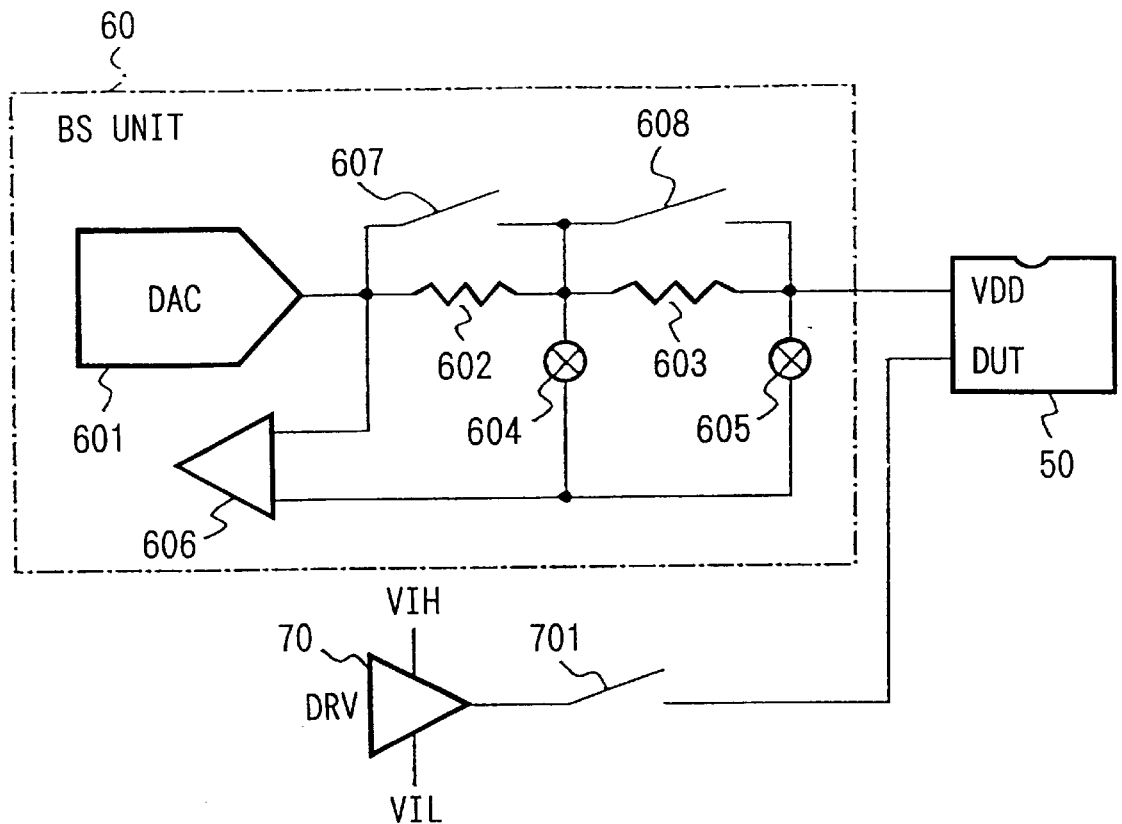
FIG. 4 is a block diagram showing an example of the source-voltage supply circuit which is provided for the IC tester to perform DC-parameter measurement on a testing IC.
Figure 5:
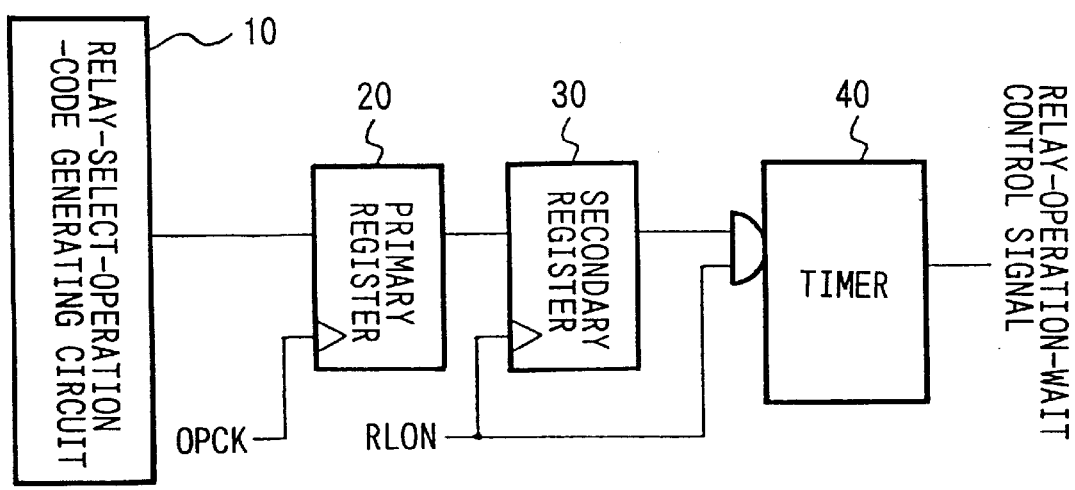
FIG. 5 is a block diagram showing a conventional example of the relay control circuit which is used to perform on/off control on the relays of the source-voltage supply circuit of FIG. 4.
Figure 6:
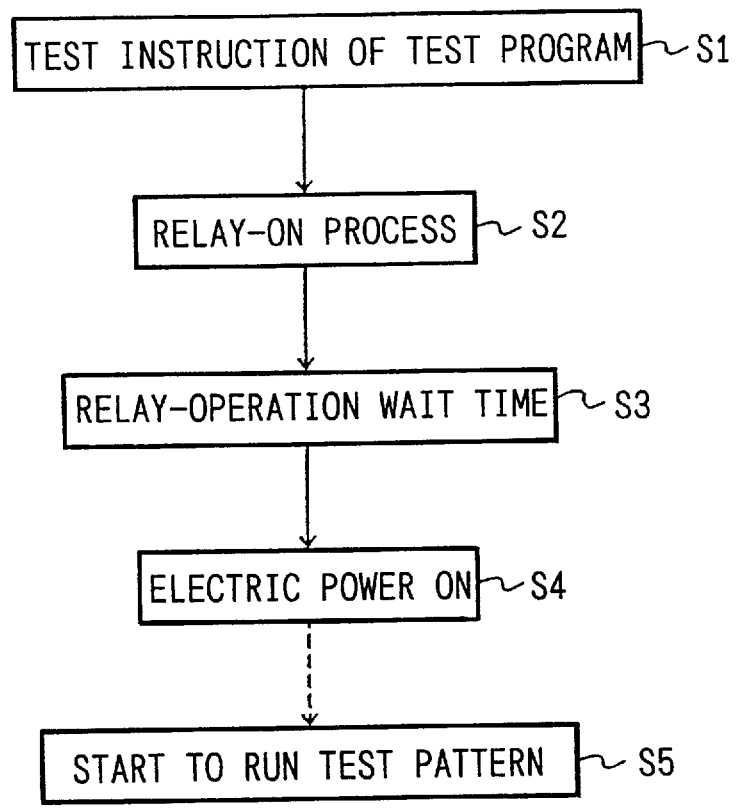
FIG. 6 is a flowchart showing a flow of processes executed by the relay control circuit of FIG. 5.

FIG. 1 shows a relay control circuit which is designed in accordance with a first embodiment of the invention and is used for the source voltage supply circuit of FIG. 4 provided for the IC tester. Herein, a relay-select-operation-code generating circuit 1 generates information (i.e., operation-code data) representing a relay (or relays) which is selected based on the content of description of a test program. So, the circuit 1 outputs the operation-code data to a relay-operation monitoring circuit 2.

The relay-operation monitoring circuit 2 is constructed by a primary register 2a, a secondary register 2b and a comparator 2c. The primary register 2a stores the operation-code data, outputted from the relay-select-operation-code generating circuit 1, in accordance with clocks 'OPCK'. Then, the operation-code data outputted from the primary register 2a are stored in the secondary register 2b in accordance with a relay-on signal RLON. The comparator 2c performs comparison between the operation-code data respectively outputted from the registers 2a and 2b so as to make a decision as to whether or not coincidence is detected between them. An output of the comparator 2c is provided as an output of the relay-operation monitoring circuit 2 and is supplied to a timer-A 3 through its AND-gate input.

The relay-on signal RLON is supplied to the timer-A 3 as well as a timer-B 4. Herein, the timers 3 and 4 operate independently of each other. So, a certain relay-operation wait time can be arbitrarily set to each timer. Relay-operation-wait control signals, respectively outputted from the timers 3 and 4, are supplied to an OR gate 5, a logical result of which is then outputted to the aforementioned driver circuit 70.

Next, the operation of the relay control circuit of FIG. 1 will be described in detail with reference to a flowchart of FIG. 2. Incidentally, the flowchart of FIG. 2 mainly shows a flow of processes to control a relay-operation wait time after execution of a TEST instruction of a test program.

Figure 2:
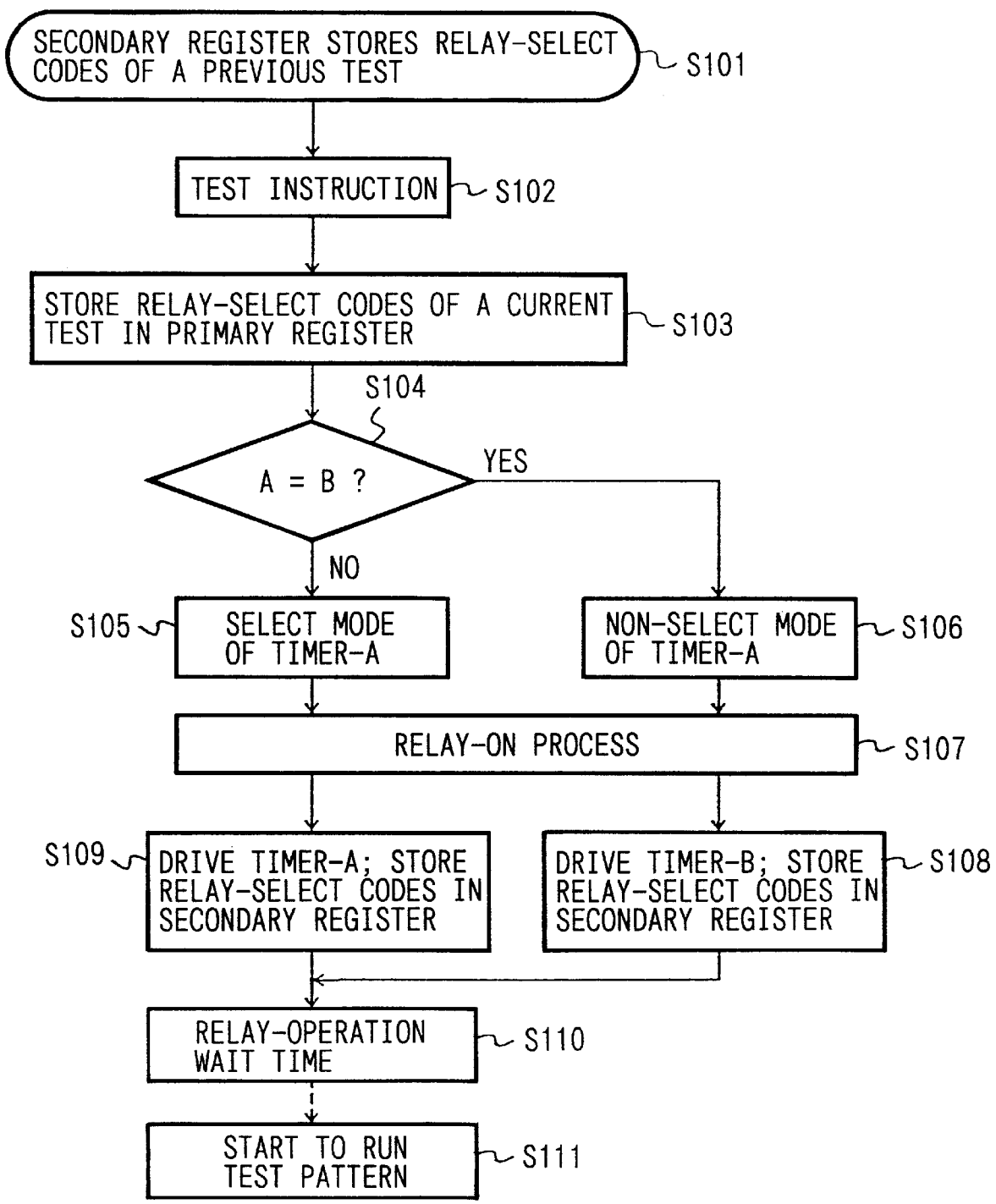
FIG. 2 is a flowchart showing a relay control process which is matched with the operation of the relay control circuit of FIG. 1.

Step S101 of FIG. 2 shows a precondition that the secondary register 2b stores relay-select codes which are generated in a previous test. Next, when a current test is executed, the relay-select-operation-code generating circuit 1 outputs operation codes of a relay (or relays) which is selected in conformity with an electric-current range described in the test program in step S102. In step S103, the primary register 2a stores relay-select codes of the current test.

After execution of the process of step S103, the comparator 2c receives current relay-select codes, outputted from the primary register 2a, as well as previous relay-select codes outputted from the secondary register 2b. So, the comparator 2c performs comparison between them.

In step S104, a decision is made as to whether or not the two kinds of the relay-select codes, described above, coincide with each other; in other words, a decision is made as to whether or not a relationship of 'A=B' is established. If coincidence is detected between them, the result of the decision of step S104 turns to 'YES', so that a program control goes to step S106 so as to set a non-select mode of the timer-A. Then, a program control goes to step S107 in which a relay-on process is executed. In step S108, the timer-B 4 is started, while relay-select codes regarding the current test are stored in the secondary register 2b.

If the result of the decision of step S104 is 'NO' indicating that the current relay-select codes do not coincide with the previous relay-select codes, program control goes to step S105 so as to set a select mode of the timer-A. Then, the relay-on process is executed in step S107. Thereafter, program control goes to step S109 in which the timer-A 3 is started, while relay-select codes regarding the current test are stored in the secondary register 2b.

The OR gate 5 receives signals respectively outputted from the timers 3 and 4. An output signal of the OR gate 5 is used to control a relay-operation wait time in step S110. This allows execution to start running of the test pattern in step S111.

As described above, the relay control circuit of FIG. 1 is constructed to provide the relay-operation monitoring circuit 2 as well as multiple timers (i.e., two timers 3 and 4) for the controlling of the relay-operation wait time. By monitoring information regarding relays which are driven in the previous test as well as information regarding relays which are driven in the current test, it is possible to select a timer which is suited to operation times of the relays to be driven. If the relay control circuit of FIG. 1 is used in the aforementioned source-voltage supply circuit, it is possible to reduce a test time in a situation where a relay whose operation speed is slow is not driven by the setting of a test program.

Figure 3:
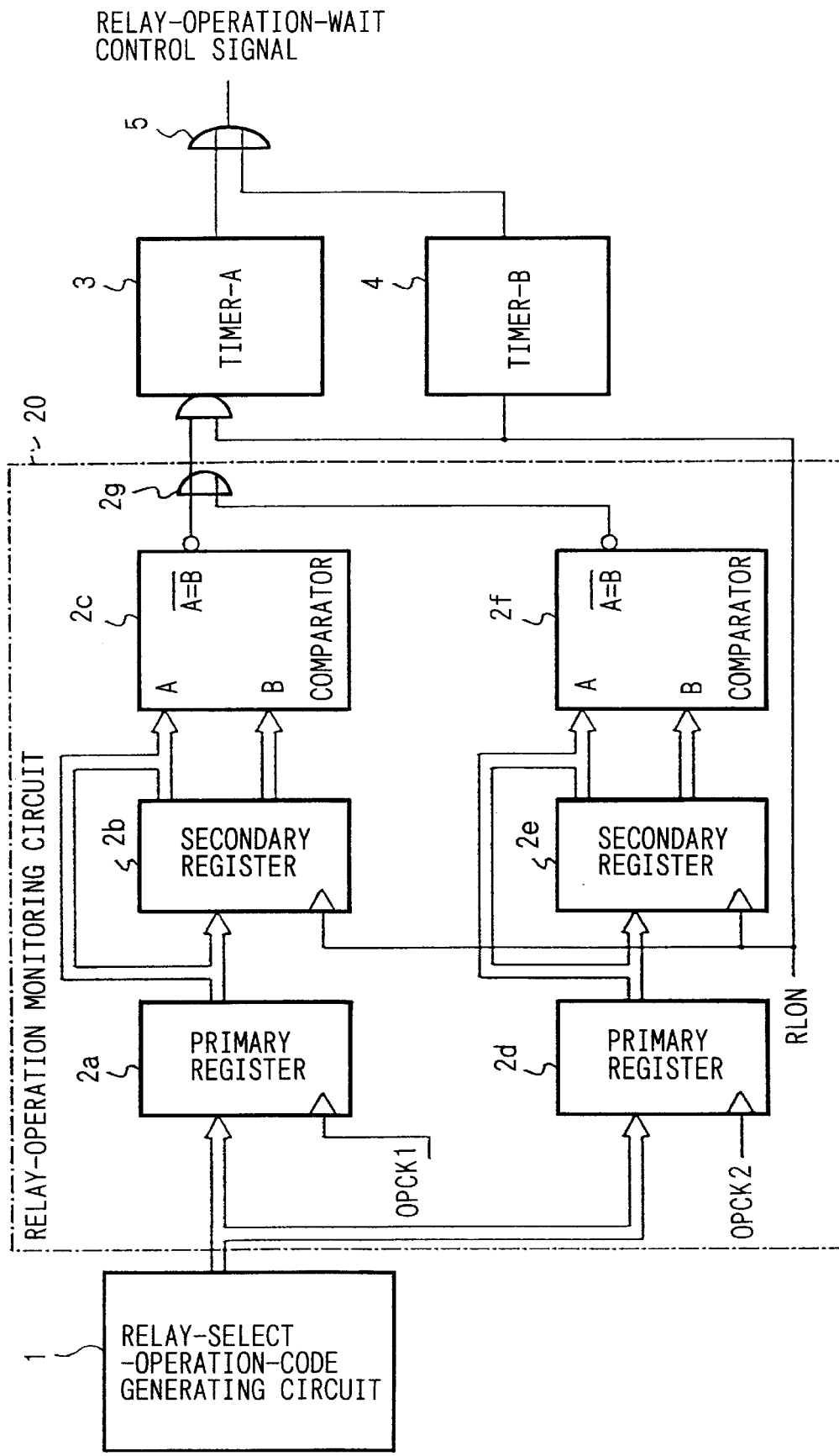
FIG. 3 is a block diagram showing a relay control circuit which is designed in accordance with a second embodiment of the invention.

Next, a detailed description will be given with respect to a relay control circuit of FIG. 3 which is designed in accordance with a second embodiment of the invention. In FIG. 3, parts equivalent to those of FIG. 1 will be designated by the same numerals; hence, the description thereof will be omitted.

A relay-operation monitoring circuit 20 shown in FIG. 3 is characterized by providing two series of the circuit 2 shown in FIG. 1. That is, there are provided a primary register 2d, a secondary register 2e and a comparator 2f in addition to the circuit elements 2a, 2b and 2c of the relay-operation monitoring circuit 2. Further, an OR gate 2g is provided to receive outputs of the comparators 2c and 2f. An output of the OR gate 2g is supplied to the timer-A 3 though its AND-gate input.

The relay-operation monitoring circuit 20 employs two kinds of relay-operation-monitoring conditions (or criteria) which relate to electric-current ranges of the relays, thus monitoring a driving relay. If one comparator does not detect an event of 'A=B' according to one relay-operation-monitoring condition, the relay control circuit of FIG. 3 selects the timer-A 3 whose operation speed is slow. If both comparators detect the event of 'A=B', the relay control circuit selects the timer-B 4 whose operation speed is fast.

In addition, two kinds of wait times are realized by the timer-A 3 and the timer-B 4 on the basis of the relay-operation-monitoring conditions and operation times of the driving relays. A time 'T3' is set to the timer-A 3, while a time 'T4' is set to the timer-B 4, wherein there is established a relationship of 'T3>T4'.

Next, a description will be given with respect to the operation of the relay control circuit of FIG. 3. Herein, there is established a precondition that relay-select codes regarding an overall test have been already stored in the secondary registers 2b and 2e, and the relay 607 of the BS unit 60 (see FIG. 4) has been selected.

When a current test is executed, its conditions (i.e., current test conditions) are supplied to the relay-select-operation-code generating circuit 1, which in turn outputs relay-select codes. The relay-select codes regarding the relay-operation-monitoring conditions are stored in the primary registers 2a and 2d respectively. Now, suppose a situation where the relay-select codes stored in the primary registers 2a and 2d coincide with relay-select codes regarding a previous test.

Next, the comparator 2c performs comparison between data respectively stored in the registers 2a and 2b, while the comparator 2f performs comparison between data respectively stored in the registers 2d and 2e. Outputs of the comparators 2c and 2f are supplied to the OR gate 2g, a logical output of which is then used as a trigger input of the timer-A 3. Thus, driving of the timer-A 3 is controlled.

In this case, the current test conditions coincide with previous test conditions. Therefore, the relay 607 of the BS unit 60 is continuously selected in the current test as well to follow the previous test. Since the relay 607 has been already put in a relay-on state in the previous test, it is not necessary to provide a wait time for a relay whose operation speed is slow.

In the above situation, both of the outputs of the comparators 2c and 2f indicate an event of 'A=B', so that a non-select mode of the timer-A 3 is set. So, the relay-on process is executed, and the timer-B 4 whose operation speed is slow is used to control a relay-operation wait time.

Incidentally, the aforementioned embodiments are provided to cope with two kinds of operation speeds of the relays. However, the number of the operation speeds of the relays is not limited to '2'. If there are provided a greater number of the operation speeds of the relays, a number of the timers provided in the relay control circuit should be increased correspondingly, while a number of the series of the relay-operation monitoring circuit 2 should be increased correspondingly.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within meets and bounds of the claims, or equivalence of such meets and bounds are therefore intended to be embraced by the claims.

What is claimed is:

1. A relay control circuit, which performs on/off control on multiple kinds of relays each having a different operation speed, comprising:

relay-select-information generating means for generating relay-select-information, representing at least one of the multiple kinds of relays, on the basis of a single relay-operation-monitoring condition applied thereto in accordance with a test program;

relay-operation monitoring means for monitoring a driving relay by detecting coincidence between current relay-select-information, regarding a current test, and previous relay-select-information regarding a previous test;

first timer means to which a first relay-operation wait time is set in response to a relay whose operation speed is slowest within the multiple kinds of relays, so that the first timer means outputs a first control signal in response to a relay-on signal with respect to the driving relay, wherein an operation of the first timer means is started only when the relay-operation monitoring means fails to detect the coincidence;

second timer means to which a second relay-operation wait time is set, wherein the second relay-operation wait time relates to a relay whose operation speed is not the slowest within the multiple kinds of relays, so that the second timer means outputs a second control signal in response to the relay-on signal with respect to the driving relay; and output means for outputting a relay-operation-wait control signal based on the first and second control signals, wherein the relay-operation-wait control signal represents a wait time for an operation of the driving relay.

2. A relay control circuit as defined in claim 1 wherein the relay-operation monitoring means further comprises:

a primary register for storing the current relay-select information regarding the current test;

a secondary register for storing the previous relay-select information regarding the previous test; and a comparator for detecting coincidence between the current relay-select information and the previous relay-select information.

3. A relay control circuit as defined in claim 1 wherein the relay-select-information corresponds to operation-code data which are allocated to each of the multiple kinds of relays.

4. A relay control circuit as defined in claim 1 wherein the output means is an OR gate which receives the first and second control signals.

5. A relay control circuit, which performs on/off control on multiple kinds of relays each having a different operation speed, comprising:

relay-select-information generating means for generating relay-select-information, representing at least one of the multiple kinds of relays, on the basis of two relay-operation-monitoring conditions in accordance with a test program;

relay-operation monitoring means for monitoring a driving relay by detecting coincidence between current relay-select-information, regarding a current test, and previous relay-select-information, regarding a previous test, with respect to each of the two relay-operation-monitoring conditions;

first timer means to which a first relay-operation wait time is set in response to a relay whose operation speed is slowest within the multiple kinds of relays, so that the first timer means outputs a first control signal in response to a relay-on signal with respect to the driving relay, wherein an operation of the first timer means is started only when the relay-operation monitoring means fails to detect the coincidence;

second timer means to which a second relay-operation wait time is set, wherein the second relay-operation wait time relates to a relay whose operation speed is not the slowest within the multiple kinds of relays, so that the second timer means outputs a second control signal in response to the relay-on signal with respect to the driving relay; and output means for outputting a relay-operation-wait control signal based on the first and second control signals, wherein the relay-operation-wait control signal represents a wait time for an operation of the driving relay.

6. A relay control circuit as defined in claim 5 wherein the relay-operation monitoring means further comprises two series of circuit means, each of which is provided with respect to each of the two relay-operation-monitoring conditions and is comprised by:

a primary register for storing the current relay-select information regarding the current test;

a secondary register for storing the previous relay-select information regarding the previous test; and a comparator for detecting coincidence between the current relay-select information and the previous relay-select information, whereby an operation of the first timer means is started only when the comparator belonging to at least one of the two series of circuit means fails to detect the coincidence.

7. A relay control circuit as defined in claim 5 wherein the relay-select-information corresponds to operation-code data which are allocated to each of the multiple kinds of relays.

8. A relay control circuit as defined in claim 5 wherein the output means is an OR gate which receives the first and second control signals.

* * * * *